United States Patent

Kobayashi et al.

[11] Patent Number: 4,996,191
[45] Date of Patent: Feb. 26, 1991

[54] METHOD FOR ETCHING SUPERCONDUCTOR MATERIALS

[75] Inventors: Takeshi Kobayashi, Osaka; Masayoshi Tonouchi, Toyonaka; Yoshiyuki Sakaguchi, Osaka, all of Japan

[73] Assignee: Lion Corporation, Tokyo, Japan

[21] Appl. No.: 284,662

[22] Filed: Dec. 15, 1988

[30] Foreign Application Priority Data

Jun. 17, 1988 [JP] Japan ................................ 63-149783

[51] Int. Cl.$^5$ ............................................ C09K 13/06
[52] U.S. Cl. ........................................ 505/1; 505/728; 252/79.2; 252/79.4; 156/664; 156/667
[58] Field of Search ............... 156/667, 664; 252/79.2, 252/79.4; 505/728, 1

[56] References Cited

U.S. PATENT DOCUMENTS 4,626,328 12/1986 Mohr ............................. 204/129.95

OTHER PUBLICATIONS

Tonouchi et al., "Chemical Etching of High-$T_c$ ... ", Jap. J. Appl. Phys., vol. 27, No. 1, Jan. 1988, pp. L98–L100.

Primary Examiner—David A. Simmons
Assistant Examiner—Thi Dang
Attorney, Agent, or Firm—Birch, Stewart, Kolasch & Birch

[57] ABSTRACT

An etchant containing 1-hydroxy-ethane-1,1-diphosphonic acid is useful in etching Ba—Cu—O and Ca—Cu—O high-temperature superconductors.

11 Claims, 3 Drawing Sheets

METHOD FOR ETCHING SUPERCONDUCTOR MATERIALS

BACKGROUND OF THE INVENTION

This invention relates to an etchant for use in wet chemical etching of barium-copper-oxygen and calcium-copper-oxygen high-temperature superconductor materials in a process of fabricating elements therefrom. It also relates to a method for chemically etching these materials.

The breakthrough discovery by Bednorz and Muller of superconductivity in the La-Ba-Cu-O system has triggered successive discoveries of many high-temperature superconductors with a transition temperature of above 90° K. It is now expected to apply these Ba-Cu-O high-temperature superconductive materials to various commercially useful forms.

For the device application of these high-temperature superconductive materials, great efforts have been made to fabricate a film therefrom by various dry plating methods including sputtering and electron beam deposition. At the same time, micro-fabrication techniques essential to fabricate elements from high-temperature superconductor films have also been investigated.

The micro-fabrication techniques generally include a lithography technique for making a fine pattern on a resist and an etching technique for transferring the resist pattern to the underlying material. To the former, the lithography which has been established in the semiconductor field is applicable without substantial modification. The latter etching technique must be individually chosen depending on a particular type of material to be treated. No effective etching method has been available partially because only a few years have passed since the discovery of a high-temperature superconductor.

The etching technique includes dry and wet processes. The dry etching process can induce a significant loss of superconductivity, particularly critical superconducting temperature (abbreviated to Tc, hereinafter) when applied to Ba-Cu-O high-temperature superconductors. As to the wet etching process, we already reported a fine patterning process using aqueous phosphoric acid as an etchant for Y-Ba-Cu-O films. Although this wet etching process does not lower the Tc of high-temperature superconductors, it requires a large amount of water for rinsing after etching. Water rinsing creates a serious problem in practice because most Ba-Cu-O systems are hydrolyzable. For example, $Y_1Ba_2Cu_3O_{7-\delta}$ system is readily hydrolyzed into CuO, Ba(OH)$_2$ and $Y_2BaCuO_5$.

It is therefore desired to develop a technique capable of wet etching high-temperature superconductors without causing the above-mentioned problems.

SUMMARY OF THE INVENTION

A primary object of the present invention is to provide a new and improved etchant which can be used in wet etching Ba-Cu-O and Ca-Cu-O high-temperature superconductors without a substantial loss of Tc and hydrolysis.

Another object of the present invention is to provide a method for chemically etching Ba-Cu-O and Ca-Cu-O high-temperature superconductors at an etching rate proportional to an etching time without a substantial loss of Tc and hydrolysis of the superconductors.

According to one aspect of the present invention, there is provided an etchant for use in etching of barium-copper-oxygen and calcium-copper-oxygen high-temperature superconductor materials, comprising 1-hydroxy-ethane-1,1-diphosphonic acid.

According to a second aspect of the present invention, there is provided a method for chemically etching a barium-copper-oxygen or calcium-copper-oxygen high-temperature superconductor material, comprising:
etching the superconductor material with an etchant comprising 1-hydroxy-ethane-1,1-diphosphonic acid.

BRIEF DESCRIPTION OF THE DRAWINGS

The above and other objects, features, and advantages of the present invention will be better understood from the following description taken in conjunction with the accompanying drawings, in which.

DETAILED DESCRIPTION OF THE INVENTION

Figure 1:
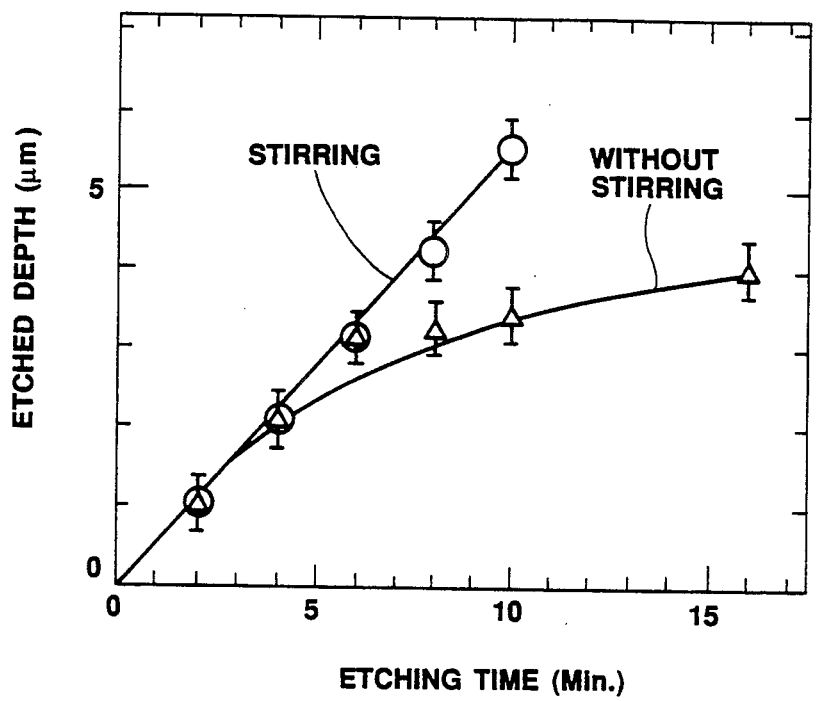
FIG. 1 is a diagram showing the etched depth vs. etching time for YBaCuO.

The superconductive materials of interest to us include barium-copper-oxygen high-temperature superconductors such as Y-Ba-Cu-O and Er-Ba-Cu-O systems including $Y_1Ba_2Cu_3O_{6.9}$ and $Y_2Ba_4Cu_8O_{16}$ and calcium-copper-oxygen high-temperature superconductors such as Bi-Sr-Ca-Cu-O and Tl-Ba-Ca-Cu-O systems including $Bi_2Sr_2Ca_2Cu_3O_{10}$ and $Tl_2Ba_2Ca_2Cu_3O_{10}$. In fabricating elements from such high-temperature superconductors by a wet etching process, we have found that an etchant comprising 1-hydroxy-ethane-1,1-diphosphonic acid of the formula:

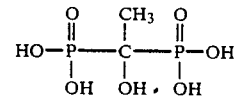

is effective in wet chemical etching of thin films of Ba-Cu-O high-temperature superconductors.

In general, the etchant used in wet etching of high-temperature superconductors should meet the requirements that (1) any desired etching rate may be selected,
(2) the etching process does not detract from the high-temperature superconductivity, particularly Tc of the material, and
(3) the resist film is maintained stable during the etching process.

We have found that these requirements are met when an etchant comprising 1-hydroxy-ethane-1,1-diphosphonic acid is used to etch Ba-Cu-O and Ca-Cu-O high-temperature superconductor thin films with stirring. As will be later illustrated in Examples, the etching rate is proportional to the etching time, is a function of the etching temperature, and falls in an adequate range. By suitably choosing the etching time and temperature, the high-temperature superconductor films can be effectively etched at a desired rate. The etching process does not bring a substantial loss of Tc or deteriorate any ordinary resist film. This etchant allows the ensuing rinsing step to be carried out with a reduced amount of water or without water, but with an organic solvent such as ethanol, avoiding hydrolysis of the superconductor material in the rinsing step. The present invention is predicated on this finding.

As defined above, the present invention provides an etchant containing 1-hydroxy-ethane-1,1-diphosphonic acid. Preferably, the etchant is subjected to an etching step in the form of a solution containing about 10 to about 80% by weight, more preferably about 35 to about 65% by weight of 1-hydroxy-ethane-1,1-diphosphonic acid in water, an aqueous lower alcohol having 1 to 5 carbon atoms, or a mixture thereof. Therefore, the etchant of the present invention may take the form of either a single agent consisting of 1-hydroxy-ethane-1,1-diphosphonic acid which is diluted with the above-mentioned solvent to an etching solution of the above-mentioned concentration upon use, or a solution having 1-hydroxy-ethane-1,1-diphosphonic acid previously dissolved in the above-mentioned solvent to the above-mentioned concentration. Non-limiting examples of the lower alcohols include methanol, ethanol and isopropylalcohol.

The etchant of the present invention is used in the wet chemical etching of Ba-Cu-O high-temperature superconductors including Y-Ba-Cu-O and Er-Ba-Cu-O systems. Etching may be carried out in an ordinary manner. More particularly, a resist film such as a photo resist film is coated on a Ba-Cu-O high-temperature superconductor film by a spin-on or another technique and then patterned by an ordinary technique such as photo-lithography such that a selected portion of the superconductor film to be etched is exposed while the remaining portion of the superconductor film not to be etched is covered with the resist film. The resist film should be insoluble in the etchant solution used in etching and the solvent used in ensuing rinsing or washing step. The film is then subjected to etching at a preferred temperature of about 0° C. to about 60° C., especially about 10° C. to about 40° C. Etching may be carried out in an ordinary manner as by immersing the superconductor in an etching solution or by spraying an etching solution to the superconductor. In the immersion method, the etching solution is advantageously stirred while etching is carried out. At the end of etching, the film is washed with an organic solvent, for example, a lower alcohol such as methanol, ethanol and isopropylalcohol, preferably ethanol to wash away the etching solution to terminate etching, and then dried. This procedure eliminates the use of water in the rinsing step, avoiding any deterioration by hydrolysis of high-temperature superconductors.

The etchant of the present invention has many advantages. It allows an appropriate etching rate to be readily selected, causes no damage to the fine-patterning resist, and enables etching of Ba-Cu-O and Ca-Cu-O high-temperature superconductors without adversely affecting the superconducting properties thereof, thus facilitating fabrication of elements from Ba-Cu-O and Ca-Cu-O high-temperature superconductors. The etchant may be employed in a variety of applications including micro processing of a multi-layered film of high-temperature superconductor layers with varying compositions, fabrication of high-temperature superconductive transistors, and fabrication of high-temperature superconductor OEIC (optical electronic integrated circuit).

EXAMPLES

Examples of the present invention are given below by way of illustration and not by way of limitation.

EXAMPLE 1

A layer of YBaCuO was deposited on a substrate of yttrium-stabilized zirconia (YSZ) to a thickness of 5 μm by RF diode sputtering. The thus formed YBaCuO had a Tc of 73 to 85° K.

A positive-type photoresist (AZ-1350J, Shipley Co.) was spin coated on the YBaCuO layer and pre-baked at 65° C. A plurality of through-holes having a diameter of 50 μm were formed in the resist film by photolithography.

The thus formed YBaCuO samples were immersed in an aqueous solution of 60% by weight of 1-hydroxy-ethane-1,1diphosphonic acid (tradename Feliox-115, manufactured and sold by Lion Corporation) at a temperature of 20° C. for a predetermined time. Immersion was done with stirring or without stirring. At the end of the predetermined time of etching, the samples were taken out of the solution, immediately washed with ethanol to terminate etching action, and then washed with acetone to remove the resist film. The YBaCuO samples were observed to find that only those portions underlying the thoughholes in the resist film were etched away like pinholes while the remaining portion maintained the same appearance as deposited. The appearance of the resist film was observed before its removal, finding no degradation.

Using an interference microscope, the depth of a cylindrical depression etched in the YBaCuO sample was measured to determine the etching rate. The results are shown in FIG. 1 in which etched depth (μm) was plotted as a function of etching time (min.) at an etching temperature of 20° C. Open circles and open triangles are for the etched depths with and without stirring the solution, respectively.

As seen from FIG. 1, continuous stirring of the solution throughout the etching process ensures that the etched depth be proportional to the etching time. The resultant etching rate was 0.5 μm/min. This etching rate is appropriate for actual fine processing of this type of superconductor.

EXAMPLE 2

The procedure of Example 1 was repeated except that etching was carried out with stirring at varying temperatures of the etching solution. The correlation of the etching rate R (μm/min.) to the temperature T (K) of the etching solution was determined. The results are shown in FIG. 2.

Figure 2:
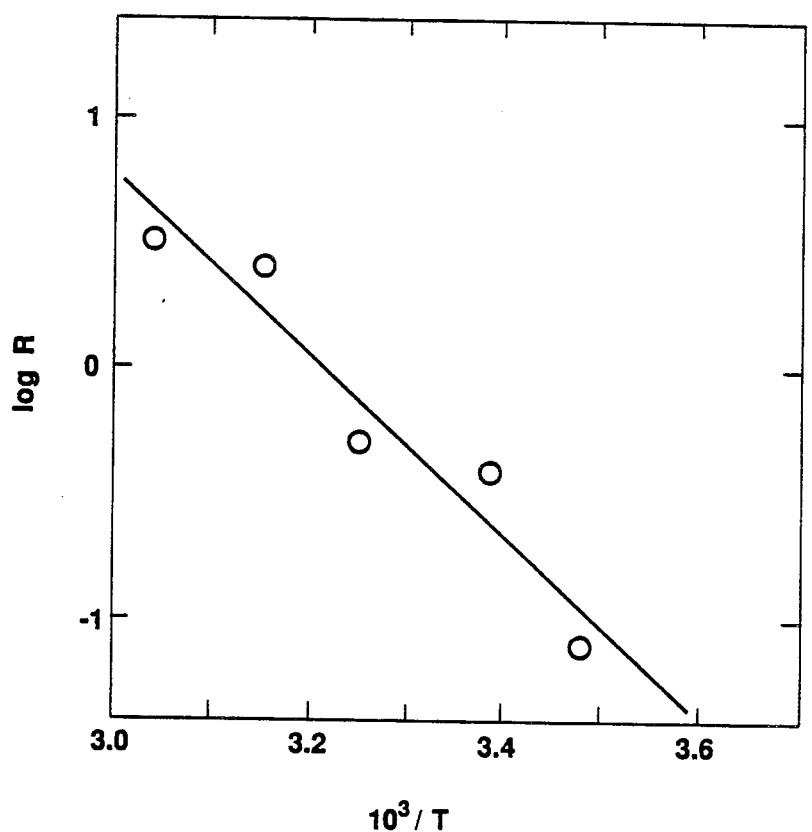
FIG. 2 is a diagram showing the dependency of etching rate on solution temperature for YBaCuO.

As seen from FIG. 2, the logarithmic value of etching rate (logR) is in a linear relationship to the reciprocal of absolute temperature (1/T). From the slope of the line, the activation energy for the reaction was estimated to be 0.32 eV. It is evident that with the etchant according to the present invention, etching can be effected at any desired rate merely by changing the etching temperature.

EXAMPLE 3

Figure 3:
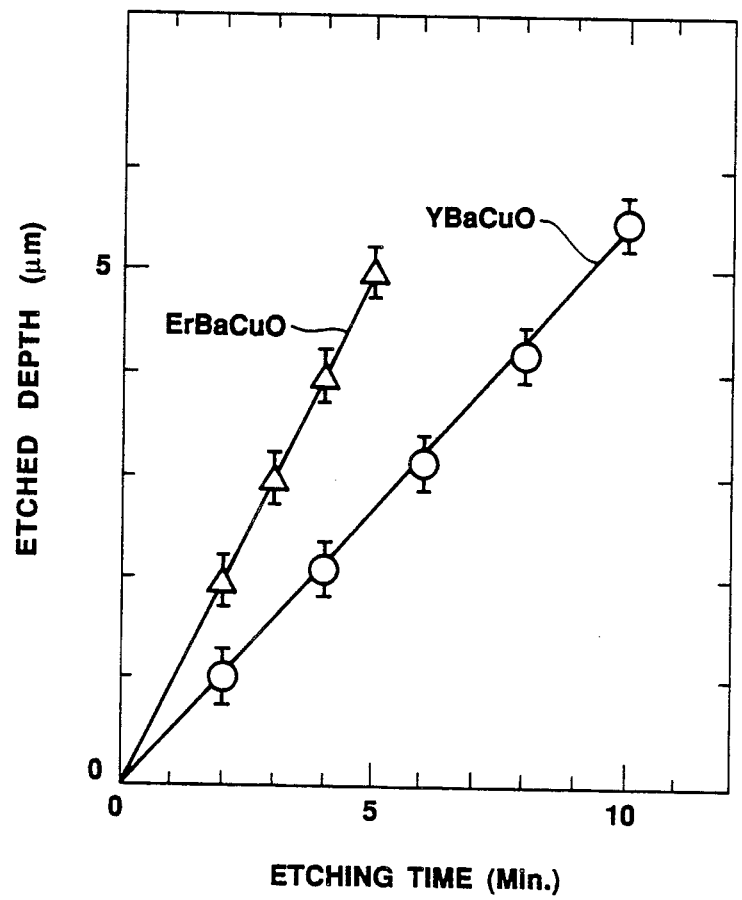
FIG. 3 a diagram showing the etched depth vs. etching time for YBaCuO and ErBaCuO.

A layer of ErBaCuO was formed under substantially the same conditions as in Example 1, and etched under the same conditions as in Example 1 with stirring to determine the etching rate at a temperature of 20° C. The results are shown in FIG. 3. For comparison purpose, the corresponding results for YBaCuO are also plotted in FIG. 3. Open circles and open triangles correspond to YBaCuO and ErBaCuO, respectively.

As seen from FIG. 3, the etching rate for the ErBaCuO film is approximately twice that for the YBaCuO film.

A similarly formed ErBaCuO film was measured for Tc both before and after etching. Tc was lowered at most about 4° K. after etching. Such a slight loss of Tc is considered to create no problem in practical application. It is thus observed that an etching process with the etchant of the present invention does not cause a substantial loss of Tc.

A similarly formed ErBaCuO film of 6 μm thick was selectively etched from the surface to a depth of 2 μm to form lines with mesa-shaped cross section of 2 μm wide.

We claim:

1. A method of chemically etching a barium-copper-oxygen or calcium-copper-oxygen high-temperature superconductor material, comprising:
   etching the superconductor material with an etchant comprising 1-hydroxy-ethane-1,1-diphosphonic acid.

2. The method of claim 1, wherein the etchant is a solution containing 1-hydroxy-ethane-1,1-diphosphonic acid in water or an aqueous lower alcohol in a concentration of about 10 to about 80% by weight.

3. The method of claim 2, wherein the etching step is carried out at a temperature of about 0° C. to about 60° C.

4. The method of claim 3, which further comprises washing the superconductor material with an organic solvent at the end of etching.

5. The method of claim 2, wherein the etchant is a solution containing 1-hydroxy-ethane-1,1-diphosphonic acid in a concentration of about 35 to about 65% by weight.

6. The method of claim 2, wherein the etchant is a solution containing 1-hydroxy-ethane-1,1-diphosphonic acid in an aqueous lower alcohol selected from the group consisting of methanol, ethanol and isopropyl alcohol.

7. The method of claim 1, which further comprises washing the superconductor material with an organic solvent at the end of etching.

8. The method of claim 7, wherein the organic solvent is a lower alcohol selected from the group consisting of methanol, ethanol and isopropyl alcohol.

9. The method of claim 8, wherein the organic solvent is ethanol.

10. The method of claim 1, wherein the etching step is carried out at a temperature of about 0° C. to about 60° C.

11. The method of claim 1, wherein the etching step is carried out at a temperature of about 10° C. to about 40° C.

* * * * *